Nov. 24, 1959 S. J. KROL ET AL 2,914,745

TERMINAL LUG

Filed Dec. 6, 1957

Inventors.
Stanley J. Krol
Edward I. Coulon
By
Byron Hume Groen & Clement
Attys.

United States Patent Office 2,914,745

Patented Nov. 24, 1959

2,914,745

TERMINAL LUG

Stanley J. Krol, Bensonville, and Edward I. Coulon, Chicago, Ill., assignors to Malco Manufacturing Company, a partnership consisting of Al Just and Margaret R. Just Application December 6, 1957, Serial No. 701,045

3 Claims. (Cl. 339—220)

This invention relates to terminal pins, or lugs, which are mounted by insertion into a base board of a printed circuit or the like, and which project from the base board to serve as electrical terminal elements to which wire leads may be attached.

The particular terminal pin herein disclosed is especially suited to electronic or electrical assemblies of printed circuits wherein certain conductive paths are provided by conducting material attached to an insulating board in a pattern suited to the particular purpose of the circuit, and requiring connection of separate wiring leads at certain points with the conductive material on the board. When making such connections a hole is provided in the base board at each point at which a terminal pin connection is to be made, and one of the pins is inserted therein. The pin is so constructed that when the board, with mounted pins, is dipped into molten solder, the attachment of the pins to the board becomes rigid, due to the formation of a soldered joint between the pin and the connective material on the board about the hole.

One of the necessary requirements of a pin herein disclosed is that it be readily usable in automatic equipment which will dispense the pin and mount it in the printed circuit base board. Thus, the pin must be capable of ready insertion into the board and also must be held in the board with reasonable security after it is so mounted and then capable of being rendered completely secure and rigid in the board.

A similar terminal pin is covered in Ronald S. Narozny Patent No. 2,811,702, issued on October 29, 1957 to the assignee of the present invention.

Terminal pins according to the present invention, and according to said Patent No. 2,811,702, are automatically mounted and secured in printed circuit boards by means of an automatic machine such as that illustrated in the co-pending application of Paul A. Maximoff, Stanley J. Krol and John B. Sola, entitled Lug Inserter, Serial No. 664,240, filed June 7, 1957, and assigned by the inventors to the assignee of the present invention. Such terminal pins are secured in the printed circuit boards by staking, and the number of pins inserted in a single operation is limited by the number which can be staked at one time. The improved terminal pins of the present invention are so constructed that at least twice as many can be staked in a single operation as compared with terminal pins of Narozny Patent No. 2,811,702.

It is an object of the present invention to provide an improved terminal pin which can be used in the base board of a printed circuit or the like.

Another object of the invention is to provide a terminal pin which may be readily inserted and staked in an improved manner in a printed circuit base board.

A further object of the invention is to provide a terminal pin adapted to be dispensed and mountd in a printed circuit board by means of an automatic dispensing machine, wherein the number of pins which can be mounted in a single operation is greatly increased over prior terminal pins.

Still another object of the invention is to provide an improved terminal pin that is readily and inexpensively manufactured.

A still further object of the invention is to provide an improved terminal pin having a large staking tolerance.

Other objects, features and advantages will be apparent from the following detailed description, taken in conjunction with the accompanying drawings, in which.

Figure 1:
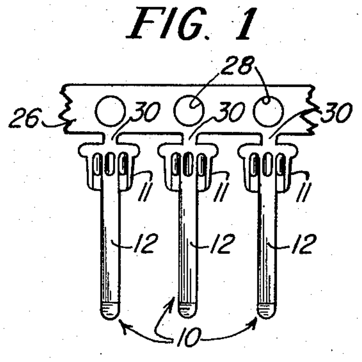
Figure 1 is a plan view of a chain including a number of terminal pins embodying the present invention.
Figure 2:
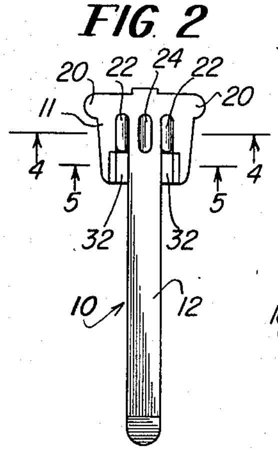
Figure 2 is an enlarged plan view of one of the terminal pins of Figure 1, shown separated from the chain.
Figure 3:
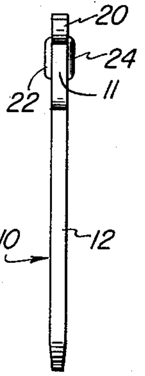
Figure 3 is an enlarged side view of the terminal pin of Figure 2.
Figure 4:
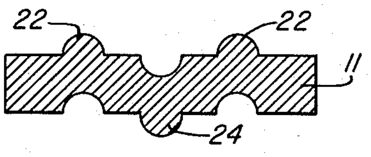
Figure 4 is a further enlarged sectional view taken along line 4—4 of Figure 2.
Figure 5:
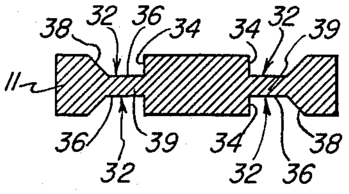
Figure 5 is a further enlarged sectional view taken along line 5—5 of Figure 2.

In the drawings the terminal pin of the present invention are designated by the reference numeral 10. Each of the pins is provided with a head 11 which is preferably generally rectangular in cross section. Integrally formed with the head of each of the pins is an elongated shank 12 of substantially the same thickness as the head but of relatively narrower width and longer length. The shank 12 is adapted to have a wiring lead (not shown) wrapped thereabout.

Each of the terminal pins 10 is intended to be mounted in an insulating base board 14 (Figure 6) carrying electrical conducting printed circuits 16 (one shown). The head portion 11 of the pin 10 is snugly received in a rectangular aperture 18 which is formed through the printed circuit and through the insulating base board. At the top of the head 11 a pair of integral flanges 20 are transversely formed from the edges thereof, and, when mounted, the flanges engage the surface of the printed circuit 16 adjacent the opening 18.

The side surfaces of the head 11 are provided with embossed portions 22, 24 adapted to engage the sides of the opening 18 in the base board 14. As shown, the terminal pin is provided with two spaced embossed portions 22 which project from one side of the terminal pin, and a single embossed portion 24 between these two which projects to the opposite side of the pin. Alternatively, the terminal pin may be provided with a single embossed portion projecting to one side only.

As shown in Figure 1, the terminal pins of the present invention may be mounted in "chain" form and in this manner fed to an automatic machine (not shown) which automatically dispenses them and sets them in the base board of a printed circuit. The chain may be provided by a thin strip of metal 26 having a number of apertures 28 therein with a web 30 between the strip 26 and each of the terminal pins. The terminal pins may be integrally formed with the chain and may be manufactured by stamping the complete unit from a single strip of metal.

In order to reduce the danger of the pin catching on the edge of the hole 18 as it is automatically inserted, the head 11 is tapered inwardly in width from its top to its bottom. A taper of approximately five thousandths of an inch per eighth inch of length has been found to be sufficient. In addition, the bottom marginal portions of the head are rounded as shown to insure that the pin is properly led into the hole in the base board.

According to the present invention, the opposite sides of the head 11 of the terminal pin are provided with opposed pairs of staking channels or grooves 32, 32. Two pairs of staking channels 32 are provided and they extend downwardly from immediately below the embossed portions 22 to the lower margin of the head. The staking grooves 32 are formed by coining or pressing the metal of the head. Each groove is defined by an inner wall 34 perpendicular to the side faces of the head, a flat floor 36 parallel to the side faces of the head, and an outwardly sloping or bevelled outward wall 38. The substantial taper of the outward wall 38 is provided to preclude any necessity for frequent sharpening of the coining tool (not shown) used for forming the grooves 32 and greatly lengthens the life of the coining tool. Webs 39 are formed between the floors of opposed pairs of grooves, and the webs are much thinner than the uncoined thickness of the head.

Figure 6:
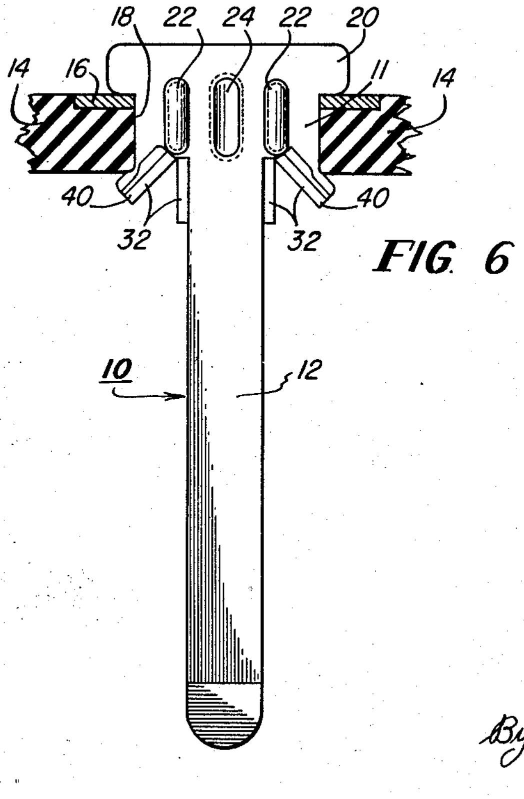
Figure 6 is an enlarged sectional view of a portion of a printed circuit base board illustrating a terminal pin of the present invention mounted therein and showing the disposition of the pin after a staking operation.

The terminal pin 10 is permanently secured in the base board 14 by holding the pin against movement out of the hole 18, splitting the lower marginal portions of the head and spreading the separated outward portions, as shown in Figure 6, to firmly stake the pin in the hole in the base board. The staking operation may be performed by means of a staking bushing (not shown) as described in detail in the copending application of Maximoff et al., Serial No. 664,240, referred to above. After the terminal pin has been staked in the board, the outward marginal portions form locking tabs 40 which prevent the terminal pin from being removed from the board.

It will be noted that the head is split along the webs 39. Because the webs are of greatly reduced thickness the head can be split much more readily, thus greatly reducing the force required. This reduces the overall staking pressure in the automatic machine, thus permitting simultaneous staking of many more pins. For example, in the machine shown in Maximoff et al., Serial No. 664,240, referred to above, twenty prior art pins could be simultaneously staked as a maximum, but when the pins of the present invention are used in the machine, forty pins or more can be readily staked on each cycle of the machine. Since the staking pressure is one of the limiting parameters, this provides a very great improvement in the operation of the machine and greatly enhances the effect of automation.

As a further important feature of the invention, the flat floors 36 of the grooves are of substantial width in order to achieve a wide tolerance in location of the staking bushings in the automatic machine. This substantially eases the set-up time of the machine and prevents shut-down due to staking bushing misalignment.

The staking grooves 32 provide another advantage by insuring that the head expands in width during staking to reduce or eliminate the initial taper which is required for automatic insertion. This stabilizes the pin in the base board and reduces any tendency for the pin to be cocked in either direction.

It will be apparent from the foregoing description that by providing a simple change in a terminal pin for automatic insertion in printed circuit boards the number of pins which can be inserted during a single cycle is at least doubled, thereby doubling the production capacity. At the same time, the present invention enhances the staking tolerance and insures that the terminal pins are more firmly set in the boards, perpendicular thereto.

Variations and modifications may be effected without departing from the scope of the novel concepts of the present invention.

We claim:

1. In a terminal pin having a generally flat head and an elongated integral generally flat shank, said pin being adapted to be mounted in an opening in the base board of a printed circuit and adapted to be staked therein by splitting and spreading a portion of the head of the pin on each side of the shank, the improvement comprising opposed staking grooves formed in opposite sides of the head on each side of the shank and providing a pair of substantially reduced thickness webs between the grooves along the lines of splitting.

2. A terminal pin according to claim 1 wherein said grooves have bevelled outer defining walls to facilitate formation of the grooves, and wherein said webs are of substantial width perpendicular to the line of splitting to allow substantial displacement of the line of splitting.

3. A terminal pin according to claim 1 wherein the width of said head is initially slightly tapered inwardly toward the shank to facilitate insertion of the pin in the opening in the base board, said staking grooves being adapted to allow said head to expand in width during staking to substantially eliminate the initial taper.

References Cited in the file of this patent

UNITED STATES PATENTS

| | | |
|---|---|---|
| 1,875,224 | Despard | Aug. 30, 1932 |
| 2,811,702 | Narozny | Oct. 29, 1957 |